(12) United States Patent
Kearney et al.

(10) Patent No.: US 8,623,707 B2
(45) Date of Patent: Jan. 7, 2014

(54) METHOD OF FABRICATING A SEMICONDUCTOR PACKAGE WITH INTEGRATED SUBSTRATE THERMAL SLUG

(71) Applicant: Cisco Technology, Inc., San Jose, CA (US)

(72) Inventors: Andrew V. Kearney, Santa Clara, CA (US); Peng Su, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/850,715

(22) Filed: Mar. 26, 2013

(65) Prior Publication Data

US 2013/0210196 A1 Aug. 15, 2013

Related U.S. Application Data

(62) Division of application No. 12/879,795, filed on Sep. 10, 2010, now Pat. No. 8,405,203.

(51) Int. Cl.
*H01L 21/00* (2006.01)
*H01L 23/10* (2006.01)

(52) U.S. Cl.
USPC ........... 438/122; 438/126; 438/127; 257/707; 257/713; 257/717; 257/720; 257/E23.051

(58) Field of Classification Search
None
See application file for complete search history.

(56) References Cited

U.S. PATENT DOCUMENTS

| | | | |
|---|---|---|---|
| 6,222,276 B1 * | 4/2001 | Bertin et al. | 257/778 |
| 6,268,239 B1 | 7/2001 | Ikeda | |
| 6,906,414 B2 | 6/2005 | Zhao et al. | |
| 6,963,142 B2 | 11/2005 | Bolken | |
| 7,327,028 B2 | 2/2008 | Chiu | |
| 7,531,905 B2 * | 5/2009 | Ishino et al. | 257/777 |
| 8,405,203 B2 * | 3/2013 | Kearney et al. | 257/707 |
| 2005/0133906 A1 | 6/2005 | Woodall et al. | |
| 2008/0073777 A1 | 3/2008 | Cul et al. | |
| 2009/0273068 A1 | 11/2009 | Kaskoun et al. | |
| 2009/0309213 A1 | 12/2009 | Takahashi et al. | |

OTHER PUBLICATIONS

Wang T. et al., "Through silicon vias filled with planarized carbon nanotube bundles," IOP Publishing, Nanotechnology 20, 2009, 485203, pp. 1-6.

Ayala, Jose L. et all, "Through Silicon Via-Based Grid for Thermal Control in 3D Chips," Nano-Net, Lecture Notes of the Institute for Computer Sciences, Social Informatics and Telecommunications Engineering, vol. 20, 2009, pp. 90-98.

* cited by examiner

*Primary Examiner* — Alonzo Chambliss
(74) *Attorney, Agent, or Firm* — Brinks Gilson & Lione

(57) ABSTRACT

To reduce the thermal stresses that may be caused by a difference in thermal expansion coefficients between a molded casing and an active side of a semiconductor device embedded in the molded casing, and thus reduce the number of corresponding failures caused by the thermal stresses, the active side of the semiconductor device is arranged face-down, towards a substrate supporting the semiconductor device. The semiconductor device includes a through via that electrically connects the active side of the semiconductor device to a passive side of the semiconductor device. A wire bond electrically connects the passive side of the semiconductor device to the substrate. To increase the dissipation of heat generated in the semiconductor device, a thermally conductive slug may be disposed in the substrate, and the active side of the semiconductor device may be attached to the thermally conductive slug.

7 Claims, 5 Drawing Sheets

METHOD OF FABRICATING A SEMICONDUCTOR PACKAGE WITH INTEGRATED SUBSTRATE THERMAL SLUG

RELATED APPLICATION

This application is a divisional of U.S. Non-Provisional application Ser. No. 12/879,795, filed Sep. 10, 2010 (now U.S. Pat. No. 8,405,203). The contents of U.S. Non-Provisional application Ser. No. 12/879,795 (now U.S. Pat. No. 8,405,203) are incorporated by reference in their entirety.

FIELD

The present embodiments relate to a semiconductor package with integrated substrate thermal slug.

BACKGROUND

In a semiconductor package, a semiconductor device may be embedded inside a molded plastic or ceramic casing, for example. A wire bond may electrically connect an active side of the semiconductor device (i.e., a side proximal an electrical component such as, for example, a transistor, resistor, capacitor or inductor formed in the semiconductor device) to a substrate, on which the semiconductor device is supported. The bond pads or other electrical connectors at the active side of the semiconductor device may face-up and be embedded in the molded casing. For example, a semiconductor device that is a microprocessor or an operational amplifier and may be used within an electronic circuit, is wire bonded in a semiconductor package.

The presence of the molded casing directly above the semiconductor device limits heat dissipation and in turn limits the power level of the semiconductor device. To help move heat generated in the semiconductor device away from the semiconductor device and towards the top of the semiconductor package, the wire bond semiconductor package may include a heat spreader embedded inside the molded casing. A heat sink may be disposed on top of the wire bond semiconductor package to aid the transfer of heat from the semiconductor package to surrounding fluid or environment.

DETAILED DESCRIPTION OF THE DRAWINGS

Overview

To reduce the thermal stresses that may be caused by a difference in thermal expansion coefficients between a molded casing and an active side of a semiconductor device embedded in the molded casing, and thus reduce the number of corresponding failures caused by the thermal stresses, the active side of the semiconductor device is arranged face-down, towards a substrate supporting the semiconductor device. A wire bond electrically connects the semiconductor device to the substrate. To increase the dissipation of heat generated in the semiconductor device, a thermally conductive slug may be disposed in the substrate, and the active side of the semiconductor device may be attached to the thermally conductive slug.

In one embodiment, an apparatus includes a substrate including a first surface and an opening, the opening extending from the first surface of the substrate at least partly through the substrate. The apparatus also includes a conducting member including a top surface and a semiconductor device including an active side. The conducting member is located in the opening of the substrate, and the active side faces and is thermally connected with the top surface of the conducting member.

In another embodiment, an apparatus includes a substrate including a first surface, a second surface and an opening, the opening extending from the first surface to the second surface of the substrate. The apparatus also includes a thermally conducting member including a first surface, the thermally conducting member being located in the opening and attached to the substrate. The apparatus includes a semiconductor device having a first side, a conductive via and transistors formed closer to the first side than a second side opposite the first side. The first side of the semiconductor device faces and is attached to the first surface of the thermally conducting member, and the conductive via extends from the second side of the semiconductor device through at least part of the semiconductor device. The first surface of the substrate is electrically connected to at least one of the transistors of the semiconductor device through a wire bond and the conductive via.

In yet another embodiment, a method includes creating an opening in a substrate, the opening extending from a top surface of the substrate to a bottom surface of the substrate. The method also includes disposing a metal slug in the opening in the substrate and attaching an active side of a silicon device to the metal slug such that the entire active side of the silicon device abuts the metal slug.

Example Embodiments

Figure 1:
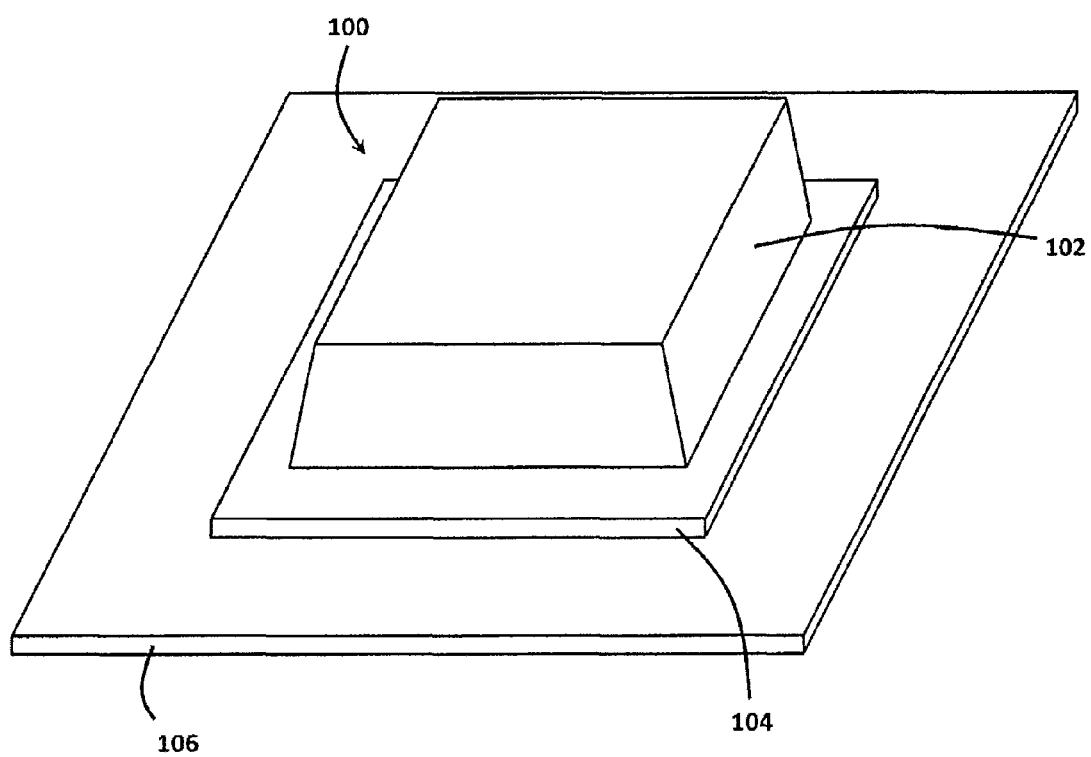
FIG. 1 illustrates a perspective view of one embodiment of a semiconductor package.

FIG. 1 illustrates a perspective view of one embodiment of a semiconductor package 100. The semiconductor package 100 includes a molded casing 102, in which a semiconductor device (shown in FIGS. 3 and 4) is embedded. The molded casing 102 is made of any number of materials including, for example, an epoxy-based resin material and has any shape.

The semiconductor package 100 also includes a substrate 104 that supports the semiconductor device and the molded casing 102. The semiconductor package 100 may or may not be supported by and connected to a printed circuit board (PCB) 106 (e.g., the semiconductor package 100 may be supported by another semiconductor package). The substrate 104 may be an organic substrate 104 (i.e., the substrate is made from a polymeric material) such as, for example, a bismaleimide triazine-based (BT-based) substrate 104. Other substrates, such as, for example, insulated metal substrates and ceramic substrates, may be used for the substrate 104.

Figure 2:
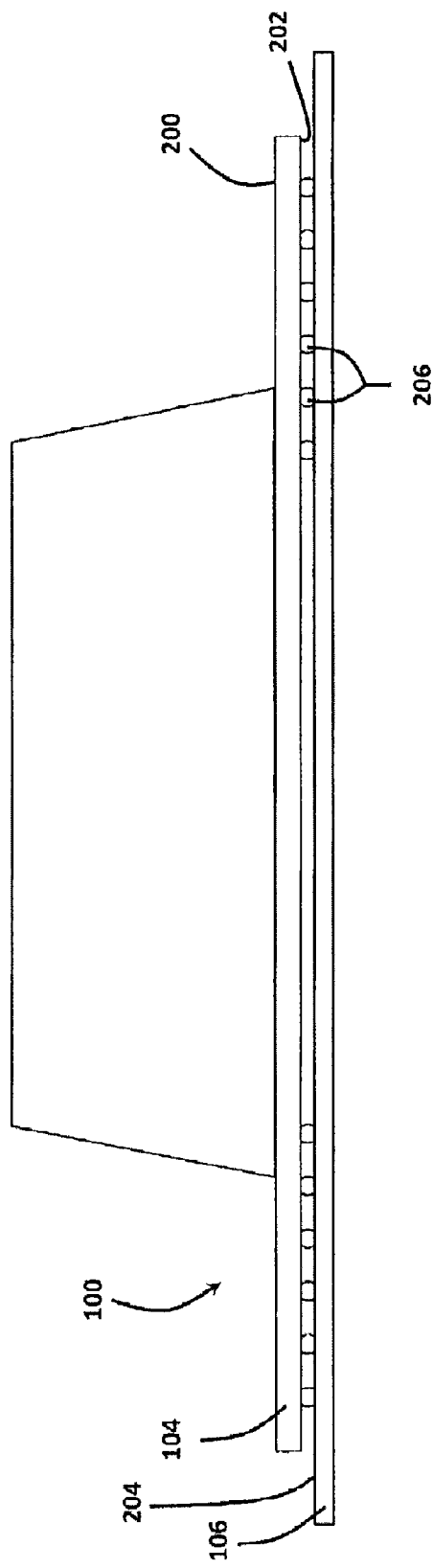
FIG. 2 illustrates a front view of one embodiment of a ball grid array semiconductor package.

FIG. 2 illustrates a front view of one embodiment of the semiconductor package 100 of FIG. 1 or a different semiconductor package, with a ball grid array. The substrate 104 includes a top surface 200 and a bottom surface 202. The bottom surface 202 of the substrate 104 may be attached to a top surface 204 of the PCB 106. The bottom surface 202 of the substrate 104 includes an array of solder balls 206 (e.g., a ball grid array (BGA)) used to conduct electrical signals from the semiconductor package 100 to the PCB 106. The BGA is attached to corresponding contact pads on the PCB 106 using, for example, reflow soldering. Other arrangements of conductive materials such as, for example, an array of conductive pins may be provided on the bottom surface 202 of the substrate 104 to conduct electrical signals from the semiconductor package 100 to the PCB 106.

Figure 3:
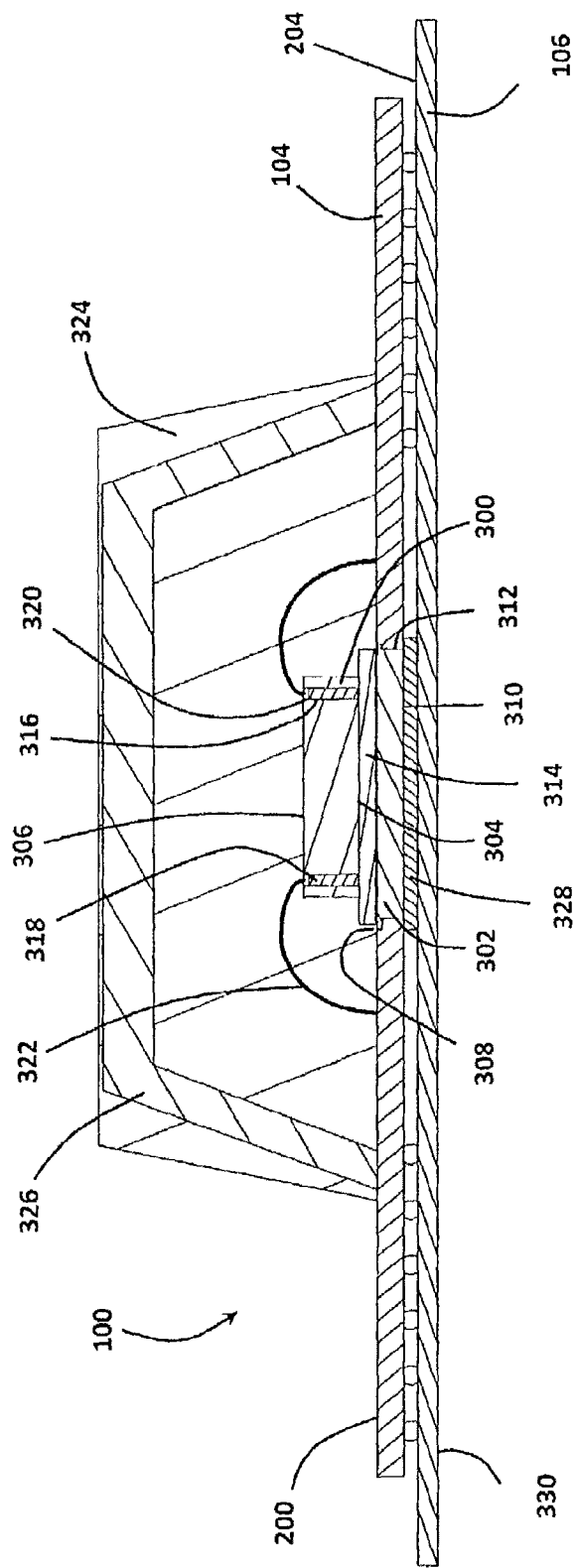
FIG. 3 illustrates a cross-section view of one embodiment of a wire bond semiconductor package.

FIG. 3 illustrates a cross-section view of one embodiment of the semiconductor package 100 of FIG. 1 or a different semiconductor package. The semiconductor package 100 includes a semiconductor device 300 and a thermal conducting member 302 (e.g., a metal slug 302). The semiconductor device 300 includes an active side 304 and a passive side 306 that may be opposite the active side 304. The active side 304 of the semiconductor device 300 may include a plurality of layers that forms an integrated circuit. In one embodiment, the active side 304 may include a plurality of stacked integrated circuits that are interconnected. The integrated circuit may include any number and combination of electrical components including, for example, transistors, memristors, resistors, capacitors and/or inductors. An outermost layer of the plurality of layers that forms the integrated circuit of the active side may be a passivation layer. The passivation layer may be silicon oxide, for example. The semiconductor device 300 may be made of any number of semiconductor materials including, for example, silicon, gallium arsenide or silicon carbide. The semiconductor device 300 may be, for example, an application-specific integrated circuit (ASIC) or a microprocessor.

The thermal conducting member 302 includes a top surface 308 and a bottom surface 310 and is disposed in an opening 312 in the substrate 104. The thermal conducting member 302 may be attached to the substrate 104 with an organic adhesive such as, for example, an epoxy adhesive. The cross-section of the thermal conducting member 302 taken in a direction parallel to the top surface 308 of the conducting member 302 may be any number of shapes including, for example, a square, a rectangle or a circle. In one embodiment, the cross-section of the conducting member 302 matches the cross section of the semiconductor device 300 taken in a direction parallel to the active side 304 of the semiconductor device 300. In other embodiments, the cross-section of the conducting member 302 may be a different size and/or shape than the cross-section of the semiconductor device 300. The thermal conducting member 302 is formed as one piece, but may be a combination of contacting pieces or pieces without contact (e.g., an array of slugs). The cross-section of the conducting member 302 may vary along the height, width or length of the conducting member 302. The top surface 308 and the bottom surface 310 of the conducting member 302 may be flat, curved, rough or have other texture or shape.

The conducting member 302 may be made of any number of thermally conductive materials including, for example, copper. In one embodiment, the conducting member 302 includes a single continuous piece of thermally conductive material. In other embodiments, the conducting member 302 may include additional pieces of the same or different conducting materials. The conducting member 302 may be a solid piece of thermally conductive material or may be hollow.

The active side 304 of the semiconductor device 300 is attached to the top surface 308 of the thermally conducting member 302 with a layer of thermal adhesive 314 disposed on the top surface 308 of the conducting member 302 and/or the active side 304 of the semiconductor device 300. The active side 304 of the semiconductor device 300 is embedded in the layer of thermal adhesive 314. The layer of thermal adhesive 314 may be any number of thermal adhesives including, for example, an epoxy resin (e.g., silver-filled). Other thermal compounds such as, for example, silicone thermal compounds or metal thermal compounds, may be used instead of or in addition to the thermal adhesive 314. Other intervening layers may be provided, such as associated with a stack of electrical components, for example. In other embodiments, the active side 304 of the semiconductor may be adhered to the top surface 200 of the substrate 104 instead of or in addition to the top surface 308 of the conducting member 302.

In one embodiment, the top surface 308 of the conducting member 302 may be adjacent to, in thermal contact with, in physical contact with and/or abut the entire active side 304 of the semiconductor device 300 to provide a thermal dissipation path for heat generated in the semiconductor device 300. In other embodiments, the top surface 308 of the conducting member 302 may be larger, smaller and/or a different shape than the active side 304 of the semiconductor device 300.

The semiconductor device 300 also includes through vias 316 (e.g., two through-silicon vias (TSVs) 316). The through vias 316 pass at least partly through the semiconductor device 300, connecting the integrated circuit of the active side 304 to the passive side 306 of the semiconductor device 300. The through vias 316 may extend in a direction generally perpendicular to the active side 304 and/or the passive side 306 of the semiconductor device 300. "Generally" allows for other angles while still extending in a direction away from the passive side 306 and/or the active side 304 of the semiconductor device 300. The through vias 316 may be filled with any number of electrically conductive materials (e.g., an electrically conductive plating 318) including, for example, copper. The semiconductor device 300 may include more or fewer through vias 316. The through vias 316 may be located anywhere on the semiconductor device 300 including, for example, at the perimeter of the semiconductor device 300 or internal to the perimeter of the semiconductor device 300.

The semiconductor device 300 may also include bonding pads 320 deposited on the passive side 306 of the semiconductor device 300. The bonding pads 320 are connected to the electrically conductive plating 318 of the through vias 316. The bonding pads 320 may be made of a different material than or the same material as the electrically conductive plating 318 of the through vias 316 (e.g., aluminum or copper). The bonding pads 320 may be formed as a single piece with the electrically conductive plating 318 of the through vias 316. The bonding pads 320 are deposited using electroplating or electroless plating, for example. The bonding pads 320 may also be adhered to the electrically conductive plating 318 of the through vias 316 with solder, for example.

In one embodiment, the semiconductor device 300 includes a redistribution layer at the passive side 306 for signal or power. The redistribution layer may include a first dielectric layer (e.g., a polyimide layer) deposited at the passive side 306 of the semiconductor device 300, a plurality of metal layers (e.g., titanium, copper and/or nickel), and a second dielectric layer deposited on top of the plurality of metal layers. Part of the first dielectric layer is removed such that one or more of the bonding pads 320 are exposed. The plurality of metal layers is patterned for redistribution of signal or power, and at least one metal layer of the plurality is in contact with one or more of the bonding pads. Part of the second dielectric layer is removed such that new bonding pads (e.g., part of one metal layer of the plurality) are exposed. The first dielectric layer may be a plurality of dielectric layers of different dielectric materials (e.g., silicon nitride and polyimide).

Wire bonds 322 (e.g., two wire bonds 322) electrically connect the bonding pads 320 of the semiconductor device 300, and thus the active side 304 of the semiconductor device 300 (e.g., through the TSVs 316), to the top surface 200 of the substrate 104 (e.g., via contact pads of the substrate 104). The wire bonds 322 may be attached to the bonding pads 320 of the semiconductor device 300 and the top surface 200 of the substrate 104 in any number of wire bonding processes (e.g., using some combination of heat, pressure and ultrasonic energy). The semiconductor package 100 may include more or fewer wire bonds 322.

The wire bonds 322 may be any number of materials including, for example, copper or gold. Copper wire is harder than gold wire, so copper wire is more difficult to bond. Copper wire, however, is less expensive than gold wire, bringing down the manufacturing costs for the semiconductor package 100. A greater bond force is applied to the wire bonds 322 when copper wire is used. Thus, a greater bond force is applied to the semiconductor device 300. The active side 304 of the semiconductor device 300 may be very fragile, and a greater bond force may cause failures within the active side 304 of the semiconductor device 300. In the present embodiments, however, the active side 304 of the semiconductor device 300 may be embedded in the layer of thermal adhesive 314. The bonding pads 320 are located at the passive side 306 of the semiconductor device 300, so the bonding force is applied to the bulk semiconductor material (e.g., silicon) at the passive side 306 of the semiconductor device 300. This may lead to fewer failures within the active side 304 of the semiconductor device 300 when bonding copper wire bonds 322 to the semiconductor device 300.

The semiconductor device 300 and the wire bonds 322 are embedded in a molding compound 324. The molding compound 324 may be any number of non-conductive material compounds including, for example, a silicon dioxide, epoxy-based resin compound. The molding compound 324 may only partially embed the semiconductor device 300.

The molding compound 324 provides structural support for the semiconductor package 100 and protects the embedded semiconductor device 300. The difference in the coefficients of thermal expansion between the semiconductor material (e.g., silicon) of the semiconductor device 300 and the molding compound 324, however, may cause high thermal stresses on the semiconductor device 300 during thermal cycling (e.g., power up/power down). Again, the active side 304 of the semiconductor device 300 may be very fragile, and high thermal stresses may cause failures within the active side 304 of the semiconductor device 300. In the present embodiments, however, the active side 304 of the semiconductor device 300 may be embedded in the layer of thermal adhesive 314 (e.g., instead of the molding compound 324), shifting the delicate active side 304 of the semiconductor device 300 away from the high thermal stress regions of the semiconductor package 100.

The semiconductor package 100 may also include a heat spreader 326 embedded in the molding compound 324. The heat spreader 326 may be made of a material with a high thermal conductivity such as, for example, nickel-plated copper and may move heat away from the heat source (e.g., the semiconductor device 300) and towards a secondary heat exchanger. The secondary heat exchanger may be a heat sink attached to the semiconductor package 100, for example. The heat spreader 326 may be completely or partially embedded in the molding compound 324. A top surface of the heat spreader 326 may be exposed to the surrounding fluid (e.g., the surrounding air) and may be air-cooled by fans.

In one embodiment, the bottom surface 310 of the conducting member 302 may be attached to a top surface 204 of the PCB 106 in any number of ways including, for example, with solder 328 or a conductive adhesive. The conducting member 302 located below the active side 304 of the semiconductor device 300 provides an additional dissipation path for heat. Heat may flow from the source (e.g., the semiconductor device 300) to the surrounding air via the layer of thermal adhesive 314, the conducting member 302, the solder 328 and the PCB 106. The additional dissipation path for heat increases the thermal performance of the semiconductor package 100 and thus increases the power at which the wire bond semiconductor package 100 may be operated.

In one embodiment, another heat sink or other heat exchanger may be attached to a bottom surface 330 of the PCB 106 to further aid the heat transfer from the semiconductor device 300 to the surrounding air. The other heat sink may be air-cooled by one or more fans.

Figure 4:
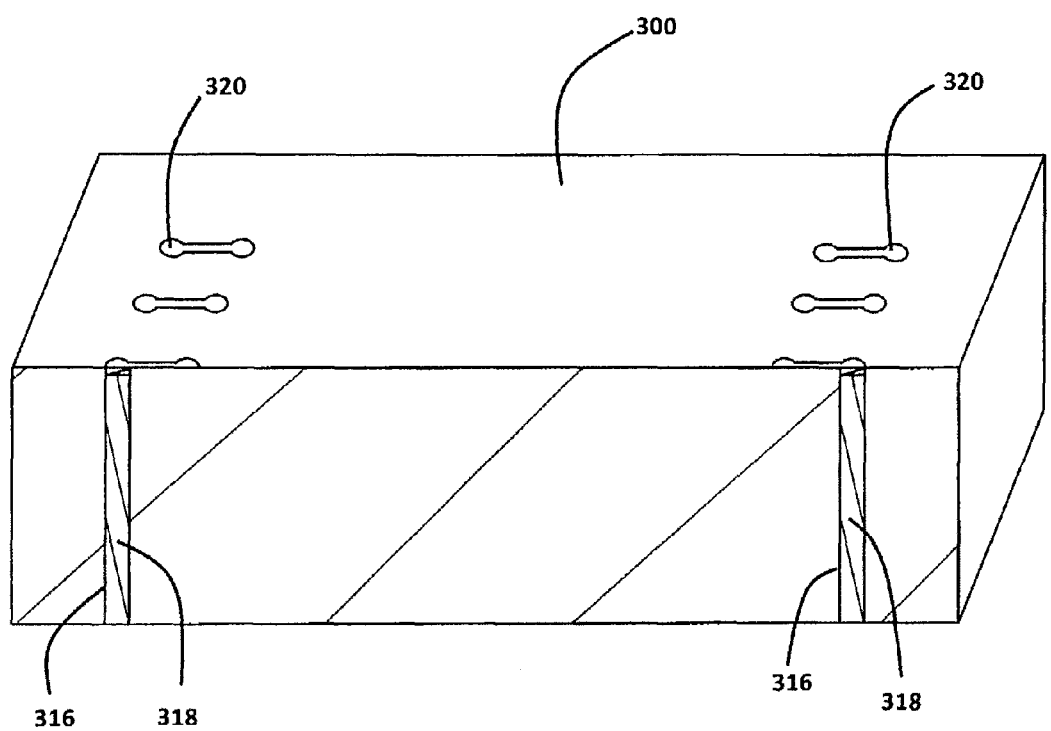
FIG. 4 illustrates a perspective view of a semiconductor device with through vias according to one embodiment.

FIG. 4 illustrates a perspective cross-sectional view of the semiconductor device 300 or a different semiconductor device with through vias. The semiconductor device 300 includes six through vias 316 with corresponding bonding pads 320. The bonding pads 320 may be re-distributed such that the bonding pads extend in a direction away from the corresponding through vias 316 (e.g., a "dog-bone" bonding pad design). The re-distributed bonding pads 320 may be used as a re-distribution layer for signal or power, for example. As described above, the bonding pads 320 may be made of a different material (e.g., aluminum) than the electrically conductive plating 318 (e.g., copper) of the through vias 316. A copper (e.g., the wire bonds 322) to aluminum (e.g., the bonding pads 320) bond may provide a stronger bond than a copper to copper bond.

Figure 5:
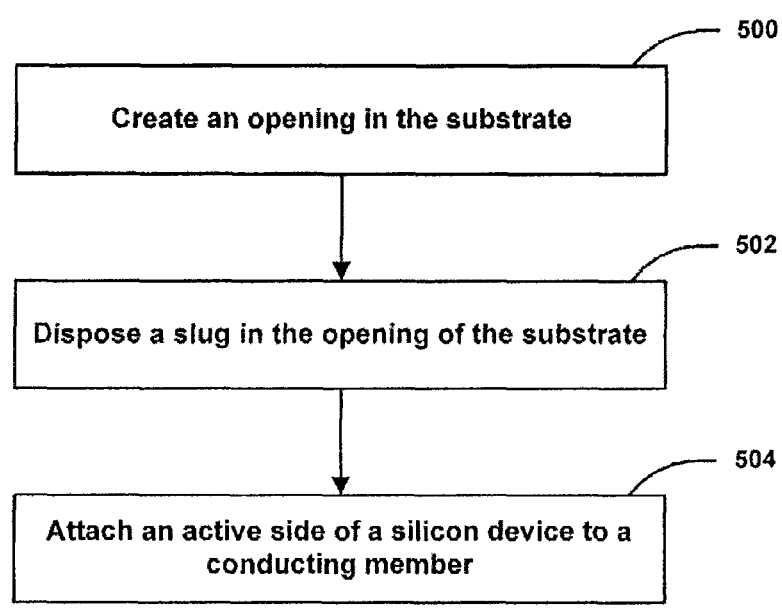
FIG. 5 illustrates a flow chart of one embodiment of manufacturing the semiconductor package of FIGS. 1-3.

FIG. 5 illustrates a flow chart of manufacturing the semiconductor package of FIGS. 1, 2 and 3 or a different semiconductor package. The method is implemented in the order shown, but other orders may be used. Additional, different, or fewer acts may be provided.

At block 500, an opening is created in a substrate. The opening may be created in any number of ways including, for example, with a drill or saw, by pressing, or by forming the substrate with the opening. The opening may extend from a top surface of the substrate to a bottom surface of the substrate. In one embodiment, the opening may extend from the top surface of the substrate but only a portion of the way through the substrate. The opening may be any number of shapes including, for example, a square or rectangle.

At block 502, a metal slug is disposed in the opening in the substrate. The metal slug may be made of copper. The metal slug may be sized to match the shape and size of the opening in the substrate. The metal slug may be a continuous, solid piece of metal or may be hollow. The metal slug may be attached to the substrate using an organic adhesive, for example. In one embodiment, the metal slug may be friction fit in the opening, with or without the use of an adhesive. Other arrangements of flanges, grooves, tabs and other extensions or indentations may be provided for the metal slug to attach and/or seat the metal slug to the substrate. A top surface of the metal slug may be in line with (i.e., flush), above or below the top surface of the substrate.

At block 504, an active side of a silicon device is attached to the metal slug such that the entire active side of the silicon device is adjacent to, contacts, is in thermal communication with, and/or abuts the metal slug. The active side of the silicon device may include a plurality of layers that forms an integrated circuit. The active side of the silicon device may be attached to the top surface of the metal slug with a layer of thermal adhesive disposed on the top surface of the metal slug and/or the active side of the silicon device. The layer of thermal adhesive may be silver-filled epoxy, for example. The metal slug may be sized and shaped to match the size and shape of the silicon device.

Through silicon vias (TSVs) may be created in the silicon device, such as by etching, laser drilling or other semiconductor process. The TSVs may be filled with an electrically conductive material such as, for example, copper. Bonding pads may be deposited on the plating of the TSVs at a passive side of the silicon device. The bonding pads may be made of a different material (e.g., aluminum) than the plating of the TSVs. The bonding pads may be deposited on the passive side using, for example, electroplating or electroless plating.

The bonding pads of the silicon device may be wire bonded to the top surface of the substrate to electrically connect the active side of the silicon device to the substrate. The wire of the wire bond may be copper or gold, for example. The bonding pads and the substrate may be wire bonded using some combination of heat, pressure and/or ultrasonic energy, for example, at each of the wire bond connections.

The metal slug may be attached to a top surface of a printed circuit board by solder, for example. Heat generated in the silicon device may flow to a surrounding fluid or environment via the layer of thermal adhesive, the metal slug, the solder and the printed circuit board.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A method comprising:
creating an opening in a substrate, the opening extending from a first surface of the substrate to a second surface of the substrate, the first surface opposite the second surface;
disposing a metal slug in the opening in the substrate;
attaching an active side of a semiconductor device to the metal slug such that the entire active side of the semiconductor device abuts the metal slug;
creating a through silicon via in the semiconductor device to extend from the active side; and
plating the through silicon via with an electrically conducting material.

2. The method of claim 1, further comprising plating a portion of the conducting material in the through silicon via with a second conducting material at an inactive side of the semiconductor device to create a bonding pad on the inactive side.

3. The method of claim 2, further comprising wire bonding the first surface of the substrate to the bonding pad on the inactive side of the semiconductor device, the wire bond electrically connecting the first surface of the substrate to the active side of the semiconductor device.

4. The method of claim 1, wherein attaching the active side of the semiconductor device to the metal slug comprises attaching the active side to a top surface of the metal slug with a layer of thermal adhesive.

5. The method of claim 1, further comprising soldering the metal slug to a top surface of a printed circuit board.

6. The method of claim 1, wherein the metal slug is a solid piece of copper.

7. The method of claim 1, wherein the size and shape of the active side of the semiconductor device is the same as the size and shape of a top surface of the metal slug.

\* \* \* \* \*